US010386423B2

United States Patent
Day et al.

(10) Patent No.: US 10,386,423 B2
(45) Date of Patent: Aug. 20, 2019

(54) THERMAL FEATURE ANALYSIS OF ELECTROCHEMICAL DEVICES

(71) Applicant: Novonix Battery Testing Services Inc., Bedford (CA)

(72) Inventors: Ryan Day, Vancouver (CA); Jeff Dahn, Halifax (CA)

(73) Assignee: NOVONIX BATTERY TESTING SERVICES INC., Bedford (CA)

( * ) Notice: Subject to any disclaimer, the term of this patent is extended or adjusted under 35 U.S.C. 154(b) by 0 days.

(21) Appl. No.: 15/557,764

(22) PCT Filed: Mar. 14, 2016

(86) PCT No.: PCT/CA2016/050277
§ 371 (c)(1),
(2) Date: Sep. 12, 2017

(87) PCT Pub. No.: WO2016/145519
PCT Pub. Date: Sep. 22, 2016

(65) Prior Publication Data
US 2018/0074132 A1 Mar. 15, 2018

Related U.S. Application Data

(60) Provisional application No. 62/134,578, filed on Mar. 18, 2015.

(51) Int. Cl.
*G01R 31/382* (2019.01)
*G01R 31/392* (2019.01)
*H01M 10/48* (2006.01)

(52) U.S. Cl.
CPC ......... *G01R 31/392* (2019.01); *G01R 31/382* (2019.01); *H01M 10/486* (2013.01)

(58) Field of Classification Search
CPC .......... G01R 31/3679; G01R 31/3606; H01M 10/486
USPC ........ 324/300, 311–319, 331, 345, 350, 463, 324/200, 213–219, 228, 232, 244–257, 324/750.12, 750.21, 500, 754.17
See application file for complete search history.

(56) References Cited

U.S. PATENT DOCUMENTS

2010/0090650 A1* 4/2010 Yazami ............... H01M 10/443
320/132
2013/0322488 A1 12/2013 Yazami et al.
2017/0098835 A1* 4/2017 Poirot-Crouvezier .... C25B 9/08

OTHER PUBLICATIONS

Ding et al., "Liquid/Solid Phase Diagrams of Binary Carbonates for Lithium Batteries : Part II," *Journal of the Electrochemical Society* 148(4):A299-A304, 2001.
Ding et al., "Liquid-Solid Phase Diagrams of Binary Carbonates for Lithium Batteries," *Journal of the Electrochemical Society* 147(5):1688-1694, 2000.

(Continued)

*Primary Examiner* — Melissa J Koval
*Assistant Examiner* — Trung Nguyen
(74) *Attorney, Agent, or Firm* — Cozen O'Connor

(57) ABSTRACT

Methods, devices, and systems are disclosed for determining certain thermal properties of electrochemical devices that contain an electrolyte. From these properties, useful information can be determined about the electrical device. For example, the state-of-health of lithium ion batteries and other electrochemical devices can be determined.

20 Claims, 11 Drawing Sheets

(56) References Cited

OTHER PUBLICATIONS

International Search Report and Written Opinion of the International Searching Authority, dated May 24, 2016, for International Application No. PCT/CA2016/050277, 8 pages.

Nelson et al., "Studies of the Effect of High Voltage on the Impedance and Cycling Performance of Li[$Ni_{0.4}Mn_{0.4}Co_{0.2}$]O2/Graphite Lithium-Ion Pouch Cells," *Journal of the Electrochemical Society* 162(6):A1046-A1054, 2015.

Nie et al., "Development of Pyridine-Boron Trifluoride Electrolyte Additives for Lithium-Ion Batteries," *Journal of the Electrochemical Society* 162(7):A1186-A1195, 2015.

Nie et al., "Erratum: Development of Pyridine-Boron Trifluoride Electrolyte Additives for Lithium-Ion Batteries [*J. Electrochem. Soc.*, 162, A1186 (2015)]," *Journal of the Electrochemical Society* 162(8):X17-X17, 2015.

Speros et al., "Quantitative Differential Thermal Analysis: Heats and Rates of Solid-Liquid Transitions," *Nature* 197(4874): 1261-1263, 1963.

Sturm, "Quantitative Differential Thermal Analysis by Controlled Heating Rates," *Journal of Physical Chemistry* 65(11):1935-1937, 1961.

Vold, "Differential Thermal Analysis," *Analytical Chemistry* 21(6):683-688, 1949.

\* cited by examiner

THERMAL FEATURE ANALYSIS OF ELECTROCHEMICAL DEVICES

TECHNICAL FIELD

The present invention pertains to methods, devices, and systems to determine certain thermal properties of an electrochemical device that contains an electrolyte, and from that to determine useful information about the electrochemical device. For instance, the invention can be used to determine the state-of-health of lithium ion batteries and other electrochemical devices.

BACKGROUND

The state-of-health of a lithium ion battery measures the fraction of life that remains should the battery continue to be operated in the same way, for example for a battery in a portable phone or a battery in an electric vehicle. The fraction of life remaining can be defined by the ratio of the number of remaining charge-discharge cycles (to occur in the future) to the total number of charge-discharge cycles that will occur over the entire life of the battery. Alternatively, the fraction of life remaining can be defined by the ratio of the remaining time (to occur in the future) that the battery will be useful to the total time that that battery will be useful. The state-of-health of any rechargeable or secondary electrochemical device can defined in a similar way.

Measuring or estimating the state-of-health of an arbitrary Li-ion battery is very difficult to do. One may not know the age of the battery, the number of charge-discharge cycles it has undergone, or the initial characteristics of the cells within the battery. Nevertheless, there are proposals to take Li-ion batteries from used electric vehicles and re-use them for grid energy storage. In such an enterprise, it will be important to know if some batteries are expected to have, e.g. 10% life remaining while others have, e.g. 90% remaining, so that when these are connected in an energy storage facility the batteries can be connected appropriately to ensure ease of replacement at an appropriate time. In addition, batteries in electric vehicles age at different rates depending on numerous factors including temperature history, driving habits, charging potential, chemistry of the Li-ion cells selected, etc., so it is important to know their state-of-health before re-using or replacing them.

Most methods to estimate state-of-health of Li-ion batteries rely upon the observation that the internal resistance or impedance of Li-ion cells generally increases with battery age. During storage and during charge-discharge cycling, reactions between the electrode materials and the electrolyte occur which generally leads to the deposition of layers of reaction products on the electrode particle surfaces and which thus increase the battery cell impedance. Therefore, if one has previous knowledge of the maximum value of the internal impedance that renders the battery still useful in the intended application, then a comparison of the present impedance to that maximum useful impedance yields a reasonable predictor of the state-of-health.

As examples of related prior art, U.S. Pat. No. 8,415,926 discloses impedance measurements to estimate state-of-health. U.S. Pat. No. 8,937,459 discloses comparisons of voltage and current to a look-up table on batteries of known degree of degradation to estimate battery state-of-health. U.S. Pat. No. 8,427,166 discloses electrical measurements of battery capacity and voltage to determine state-of-health. U.S. Pat. No. 8,589,097 discloses a method that compares the voltage of a battery under load and after elimination of load (open circuit) to estimate state-of-health. U.S. Pat. No. 8,680,815 discloses a method involving comparisons of dQ/dV (differential capacity) vs V (voltage) of the battery under load to those of a reference anode and cathode. U.S. Pat. No. 8,116,998 discloses a method in which internal resistances of batteries are compared to a predetermined critical resistance threshold. U.S. Pat. No. 7,554,294 discloses a method in which a full AC impedance spectrum is used to characterize battery health. U.S. Pat. No. 6,456,043 discloses a method of monitoring of voltage and capacity during storage periods to determine state-of-health of the battery. All the aforementioned prior art references use some sort of electrical measurement to determine the state-of-health and require prior knowledge of the battery behaviour throughout its lifetime.

By contrast, US Patent Application 2014/0107949 discloses a method in which a stress/strain sensor mounted on the battery is used to determine the state-of-health of a battery by comparison to previously measured stress/strain data for batteries at a different state of charge and different state-of-health. This method involves substantial prior knowledge of the battery behaviour throughout its entire lifetime.

Recent publications on next generation high-voltage Li-ion cells have shown that appropriate electrolyte additives can mitigate against steady impedance increase but that Li-ion cells still show failure, instead, by rapid impedance growth very near end of life. [For example, K. J. Nelson, G. L. d'Eon, A. T. B. Wright, L. Ma, J. Xia and J. R. Dahn, Studies of the effect of high voltage on the impedance and cycling performance of Li[$Ni_{0.4}Mn_{0.4}Mn_{0.2}$]$O_2$/graphite lithium-ion pouch cells, J. Electrochem. Soc. 2015 162(6): A1046-A1054; doi: 10.1149/2.0831506jes and Mengyun Nie, Jian Xia and J R. Dahn, Development of Pyridine-Boron Trifluoride Electrolyte Additives for Lithium-Ion Batteries. J. Electrochem. Soc. 2015 162(7): A1186-A1195; doi: 10.1149/2.0271507jes]. This means that traditional state-of-health measurements may not yield accurate assessments of the fraction of life remaining. A new method for state-of-health determination is required.

The present invention addressed these needs and provides further benefits as disclosed below.

SUMMARY

As liquid electrolytes in Li-ion battery cells react with the charged electrode materials during operation, solid, polymeric and gaseous reaction products are created and the amount of liquid electrolyte remaining within the cells decreases. As is well known, liquids, like water and sea water, freeze when the temperature is lowered below the freezing point and ice melts when the temperature is increased above the melting point. There is a latent heat of fusion associated with the phase transition from solid to liquid. This is why the temperature of a glass of ice water in a 20° C. room remains very near 0° C. until all the ice has melted; and only then does the temperature of the water begin to increase. In fact, the more ice initially in the glass, the longer the glass of ice water will remain at 0° C. before the temperature begins to rise. The same logic can be applied to a lithium ion battery cell which has been cooled to a point where the electrolyte has frozen. The more liquid electrolyte remaining in the cell, the longer the cell will remain at the electrolyte melting point as the cell warms.

The magnitudes of the thermal features associated with such phase transitions are easily measured with instruments such as a differential scanning calorimeter (DSC) or a differential thermal analyzer (DTA). However, to measure the amount of liquid electrolyte remaining in a Li-ion cell, a specialized differential thermal analyzer is preferably used that can perform DTA measurements on an entire Li-ion cell without compromising the integrity of the cell. Without being bound by theory, it is our premise that the fraction of liquid electrolyte remaining in the Li-ion cell is directly related to the state-of-health of the cell. Therefore, a DTA that can perform non-invasive measurements on a complete Li-ion cell to determine the fraction of electrolyte remaining (in-situ) can determine the state-of-health of the Li-ion cell. Further, a DTA system designed to take measurements on full Li-ion cells can also be used to determine or infer electrolyte composition.

Changes in thermal behaviour can be used to learn about the degradation modes of the Li-ion cell in addition to determining the fraction of electrolyte remaining. Furthermore, should changes to the electrolyte occur when Li-ion cells are operated outside manufacturer's specifications, then these could be detected using DTA measurements on Li-ion cells. Such measurements may be useful in determining if use of Li-ion batteries has voided a warranty or if battery management systems may have allowed overcharge, for example, at some point during battery operation.

Any battery or other electrochemical device incorporating liquid electrolyte which can be frozen and where the liquid electrolyte is depleted over time during battery operation can be characterized with the instant invention. This includes batteries comprising certain polymer electrolytes since even polymers have DSC and DTA features such as melting and glass transition temperatures that, in principle, will be affected by cell degradation. For example, the thermal signatures of a PEO-based (polyethylene oxide-based) electrolyte (Bathium cell) may change with state-of-health. In cases where the depletion of the liquid electrolyte leads to cell degradation, state-of-health can be determined. Examples of such battery chemistries include Na-ion, Mg-ion, Ca-ion, Li—S and dual graphite. Furthermore, the invention is not limited to batteries and is applicable to many electrochemical devices. For example, electrochemical supercapacitors and carbon-carbon ultracapacitors can be so characterized.

Specifically, the present invention includes a method of determining a state-of-health property of an electrochemical device comprising an appropriate liquid and/or polymer electrolyte. The method comprises measuring the thermal features associated with transitions of portions of the liquid electrolyte or polymer electrolyte, comparing the measured thermal features to those of a reference electrochemical device, and deducing the state-of-health property from the comparison.

The state-of-health property of the electrochemical device which can be determined in such a manner includes but is not limited to cycle life, lifetime, electrolyte composition, exposure to overcharge abuse, and operation outside of manufacturer specifications.

The method is suitable for use with electrochemical devices including batteries, supercapacitors, and ultracapacitors. The method is particularly suitable for use in determining the lifetime of a rechargeable lithium ion battery.

In an embodiment of the method, the thermal features are measured as the temperature of the electrochemical device is varied. The measuring step can comprise differential thermal analysis or differential scanning calorimetry.

The invention also includes thermal feature measuring devices (e.g. differential scanning calorimetry or differential thermal analysis devices) for measuring the state-of-health property of an electrochemical device according to the aforementioned methods. A particularly suitable differential thermal analysis device is for measuring thermal features of a rechargeable lithium ion battery. Further, the invention includes a differential thermal analysis system for measuring the state-of-health property, in which the system comprises the aforementioned differential thermal analysis device.

DETAILED DESCRIPTION

Unless the context requires otherwise, throughout this specification and claims, the words "comprise", "comprising" and the like are to be construed in an open, inclusive sense. The words "a", "an", and the like are to be considered as meaning at least one and are not limited to just one.

In the present application, a relevant electrolyte may be a liquid or a polymer electrolyte and has a density greater than 400 kg/m$^3$. Further, a relevant electrolyte is characterized by at least one transition including for instance a melting transition, other phase transition, or a glass transition. A relevant liquid electrolyte includes those commonly defined as a fluid which flows to conform to the walls of a container in which it is placed. Examples of liquid electrolytes in this application include typical Li-ion battery electrolytes such as 1M LiPF$_6$ ethylene carbonate:ethyl methyl carbonate and typical electrolytes found in a carbon-carbon ultracapacitors such as tetrabutylammonium phosphorus hexafluoride dissolved in acetonitrile. Some electrochemical devices may have electrolytes which are polymeric at their operating temperature but become liquid at higher temperature. Some electrochemical devices may have gel polymer electrolytes or polymers plasticized by liquid electrolytes. Such devices can also be characterized by the present invention.

Figure 1:
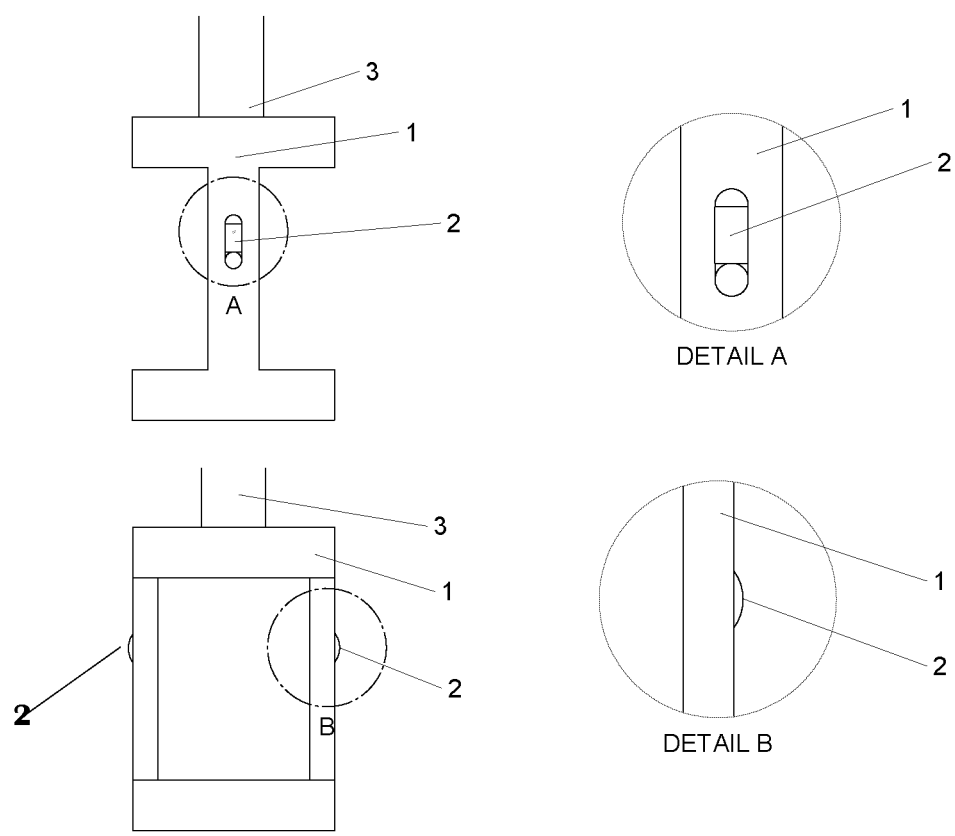
FIG. 1 shows a diagram of an exemplary cell holder used to mount 402035-size pouch type Li-ion cells in a DTA of the invention. The detailed views show an expanded view of the RTD.
Figure 2:
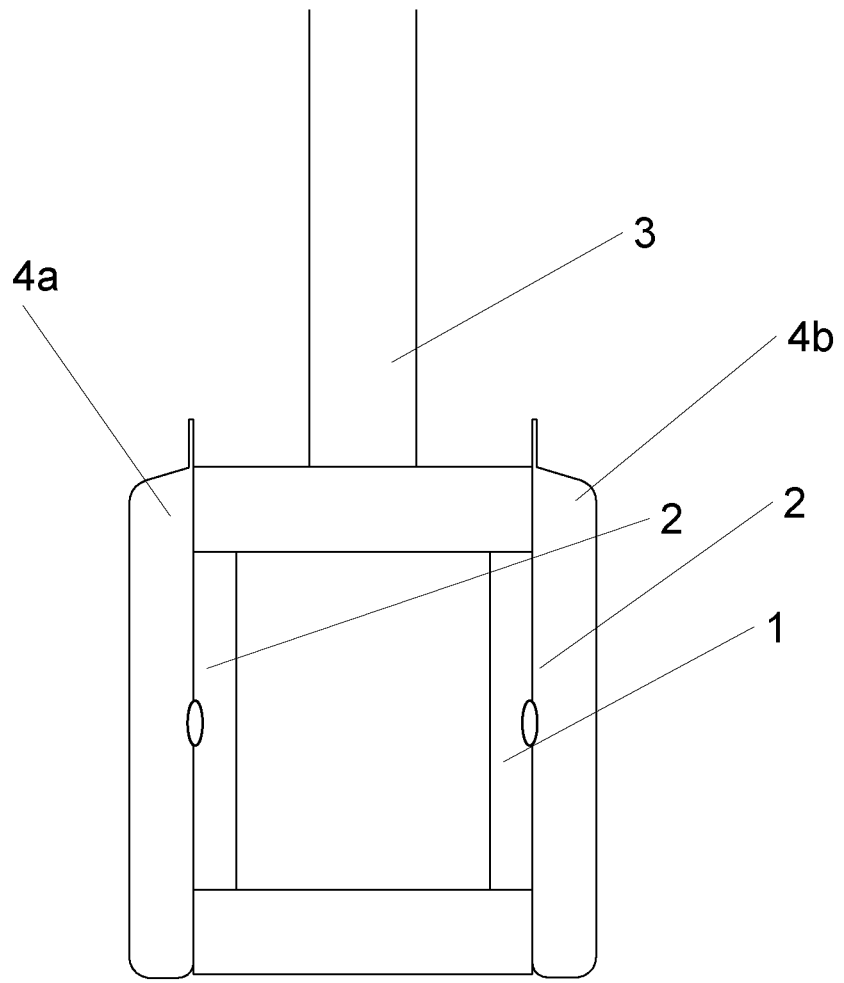
FIG. 2 shows a side view for a diagram of the cell holder of FIG. 1 with 402035-size pouch cells mounted.

Electrolytes of Li-ion batteries are known to freeze and melt according to their phase diagrams as published in the scientific literature. For example, Ding et al. [J. Electrochem. Soc. 147 18688 (2000) and J. Electrochem. Soc. 148 A299 (2001)] used DSC to measure the phase diagram of various solvent mixtures commonly found in Li-ion batteries as electrolyte solvent. FIG. 1 in Ding et al. [J. Electrochem. Soc. 147 18688 (2000)] shows a typical DSC experiment on a mixture of ethylene carbonate (EC) and dimethyl carbonate (DMC) which shows thermal features (thermal anomalies) at the temperatures of the liquidus and solidus points in the phase diagram. By completing DSC experiments on a large number of EC:DMC mixtures it was possible to map the entire phase diagram (which describes the temperatures over which solids, liquids and mixed phases exist) of the EC:DMC system as shown in FIG. 2 of Ding et al. [J. Electrochem. Soc. 147 18688 (2000)].

DSC experiments are typically made on very small samples of 2-20 mg. Differential Thermal Analysis is a similar technique which can also measure thermal features (thermal anomalies) associated with transitions (e.g. phase transitions) and is also normally practiced on small samples of a few milligrams. For comparison, a typical 402035 pouch cell contains approximately 900 mg of electrolyte. In both DSC and DTA, the size of the thermal feature (measured as heat flow in watts in DSC or as a temperature difference between sample and reference in DTA) is proportional to the mass of the sample undergoing the transition. A DSC instrument manufactured by TA Instruments is the Q1000, which is used in numerous laboratories around the world.

DSC instruments heat a sample, which shows a transition, and a reference sample, which does not have a transition, at a fixed rate while measuring the heat flow to the sample and to the reference required to provide the desired heating rate. When a transition, like melting or other phase transition, is encountered, additional heat is applied to the sample to provide the latent heat of fusion compared to the heat provided to the reference sample. DSC instruments could be built to satisfy the requirement of the inventive method, but they are more complex than DTA instruments.

One early scientific paper describing differential thermal analysis (DTA) is that of M. Vold [Analytical Chemistry, 21, 683 (1949)]. In the DTA method, the sample and a reference (which does not show a transition) are heated by contact with air in an appropriate device. Vold writes: "The experimental procedure consists of heating or cooling the sample side by side with an inert reference material in the same furnace, and measuring both the sample temperature and the temperature difference between sample and reference material as a function of time. When a phase change occurs involving absorption or evolution of heat, the temperature difference between reference and sample begins to increase; after the transformation is complete the temperature difference declines again. Thus each transformation produces a peak in the curve of temperature difference against time, from which it should be possible to derive information about the transformation temperature, heat of transformation, and rate of transformation."

Later work by E. Sturm [Journal of Physical Chemistry, 65, 1935 (1961)] and Speros and Woodhouse [Nature 197, 1261 (1963)] showed that the DTA method could be quantitative. In these papers, the authors show that the size of the thermal feature (thermal anomaly) as measured by DTA is directly proportional to the total heat required for the transition. One embodiment of the present invention includes DTA systems designed to measure the fraction of liquid electrolyte remaining in Li-ion cells which can be used as a state-of-health indicator.

A DTA system designed to take measurements on full Li-ion cells can also be used to determine or infer electrolyte composition. FIGS. 2 through 11 of Ding et al. [J. Electrochem. Soc. 147 18688 (2000)] and FIGS. 1 through 6 of Ding et al. [J. Electrochem. Soc., 148, A299 (2001)] show that the phase diagrams of Li-ion battery binary electrolyte solvents depend on the solvents and upon the ratio of solvents used. For example, the liquidus lines are strongly dependent on solvent ratio while both the solidus and liquidus lines are strongly affected by salt content. This means that if one solvent is preferentially consumed compared to the others during the life of a Li-ion cell, the thermal signature associated with melting or freezing of the electrolyte will also change. These changes in thermal behaviour can be used to learn about the degradation modes of the Li-ion cell in addition to determining the fraction of electrolyte remaining. Furthermore, should changes to the electrolyte occur when Li-ion cells are operated outside manufacturer's specifications, then these could be detected using DTA measurements on Li-ion cells. Such measurements may be useful in determining if use of Li-ion batteries has voided a warranty or if battery management systems may have allowed overcharge, for example, at some point during cell operation.

As an exemplary illustration of the invention, a DTA system constructed to take measurements on 402035-size Li-ion pouch cells is described. FIG. 1 shows a diagram of a cell holder used to mount 402035-size pouch type Li-ion cells in the inventive DTA. The cell holder consists of polypropylene frame 1 with two 100 ΩPt resistance temperature devices (e.g. RTD—US Sensor—Pt. PPG101A1) 2 mounted slightly "proud" of the surface of the polypropylene frame. The polypropylene frame is attached to a piece of ¼" diameter thin-walled stainless steel tubing 3. RTDs 2 were soldered directly to 36AWG Phosphorus-Bronze alloy QuadLead cryogenic wire from Lakeshore (Lakeshore—QL36). These leads complete a full wrap of the "I" shaped profile of the frame and are heat sunk to frame 1 using a layer of GE varnish and Kim wipe before switching to 24AWG copper wire which is fed up through the inside of the stainless steel tubing. This is done to avoid thermal noise from the lab environment from corrupting the temperature signal. The 24 AWG copper wires were fed through the inside of the stainless steel tubing. Detailed view A shows an expanded view of RTD 2. Detailed view B shows an expanded side view of RTD 2.

FIG. 2 shows a side view for a diagram of the cell holder of FIG. 1 with sample and reference 402035-size pouch cells installed. FIG. 2 shows reference Li-ion cell 4a mounted on one side of the frame such that it is pressed firmly against reference RTD 2 and sample Li-ion cell 4b mounted on the other side of the frame such that it is firmly pressed against sample RTD 2. The cells are held in position by wrapping two "bread bag" twist ties around the cells and frame and tightening them firmly.

Figure 3:
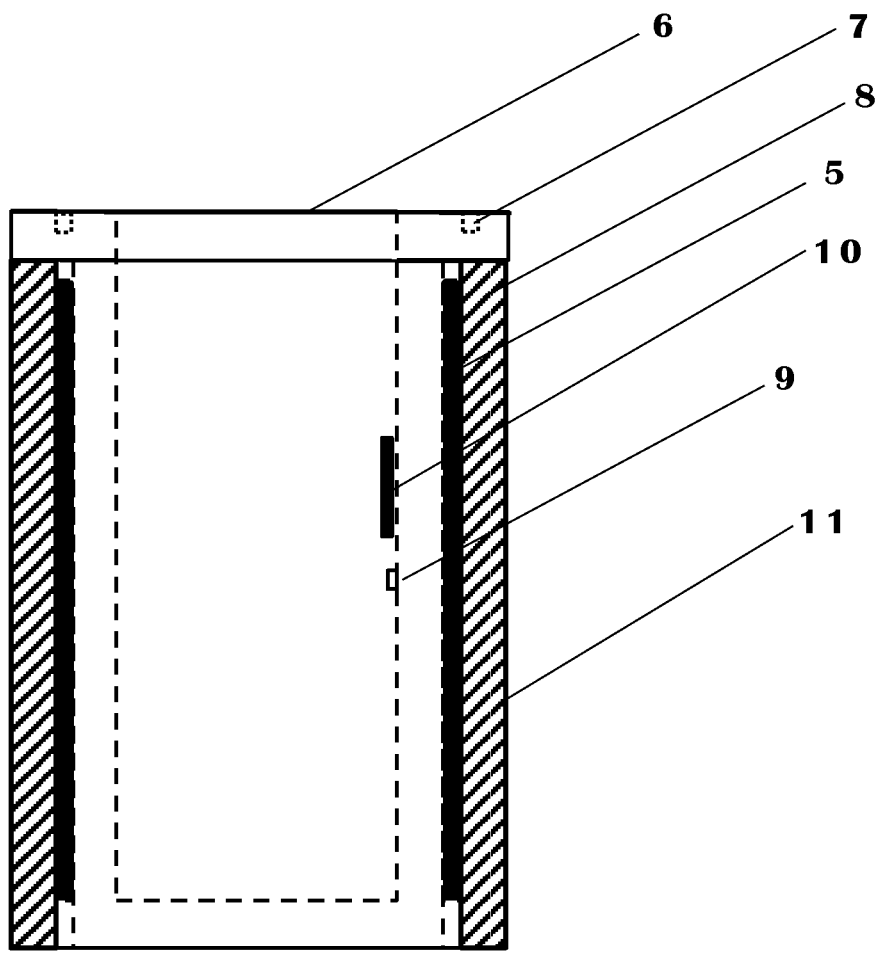
FIG. 3 shows a side view diagram of the cryostat can.
Figure 4:
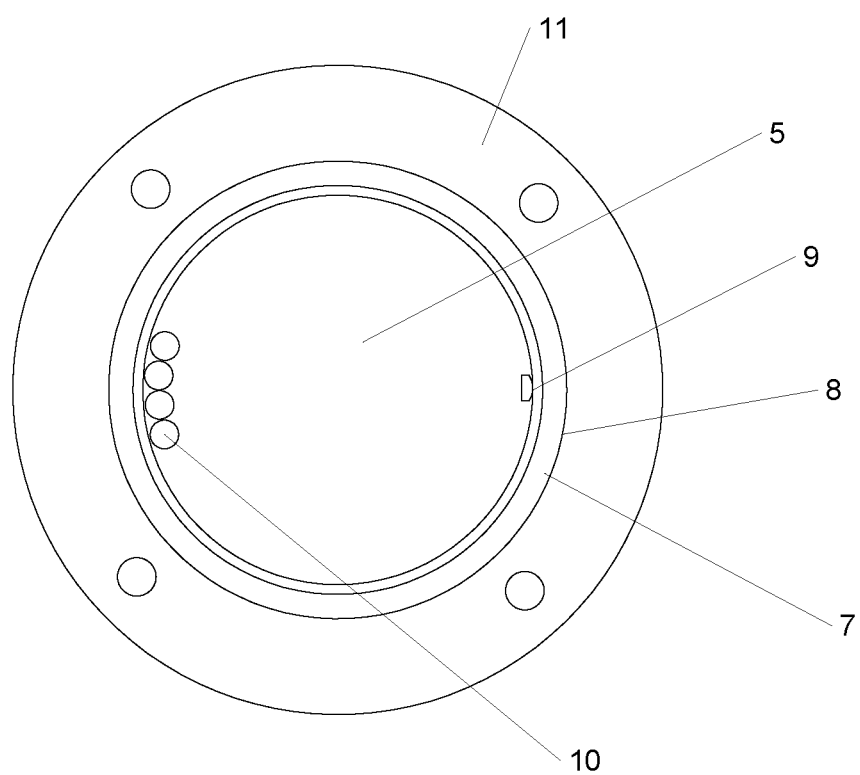
FIG. 4 shows a top view diagram for the cryostat can.

In the method, the cell holder and cells are then cooled to low temperature and then heated back to room temperature to observe freezing and melting. This is accomplished by placing the cell holder in a specially designed cryostat. FIG. 3 shows a side view diagram of an exemplary aluminum cryostat can 5 complete with top flange 6 and o-ring groove 7. A 28 W electric band heater 8 (Electroflex—EFH KH-2X6-2.5-28A) is wrapped around the outside of the can. Control RTD 9 is attached to the inside of can 5 so that the cryostat can temperature can be monitored while it is controlled by, for instance, a Lakeshore Cryotronics model 340 temperature controller. Control RTD 9 is held in place using a thermally insulating layer of Stycast (2850FT and Cat24LV) around the rear and sides of the sensor to promote thermal coupling to the cryostat can alone. Cryostat can 5 is mounted and removed to install cells on the cell holder, and thus the control RTD wires are attached to female electrical connector 10 (TE Connectivity—66105-4) for ease of installation. As with the sense RTDs 2, control RTD 9 is heat sunk using QuadLead cryogenic wire that wraps around the inner circumference of the cryostat before switching to copper wire for feeding out. Finally, the walls of cryostat can 5 are wrapped with a layer of alumina wool insulation 11 and a plastic sheet to hold the alumina wool in place. No insulation is applied to the bottom of the cryostat can. FIG. 4 shows a top view diagram of cryostat can 5. The labelling of parts is the same as in FIG. 3.

Figure 5:
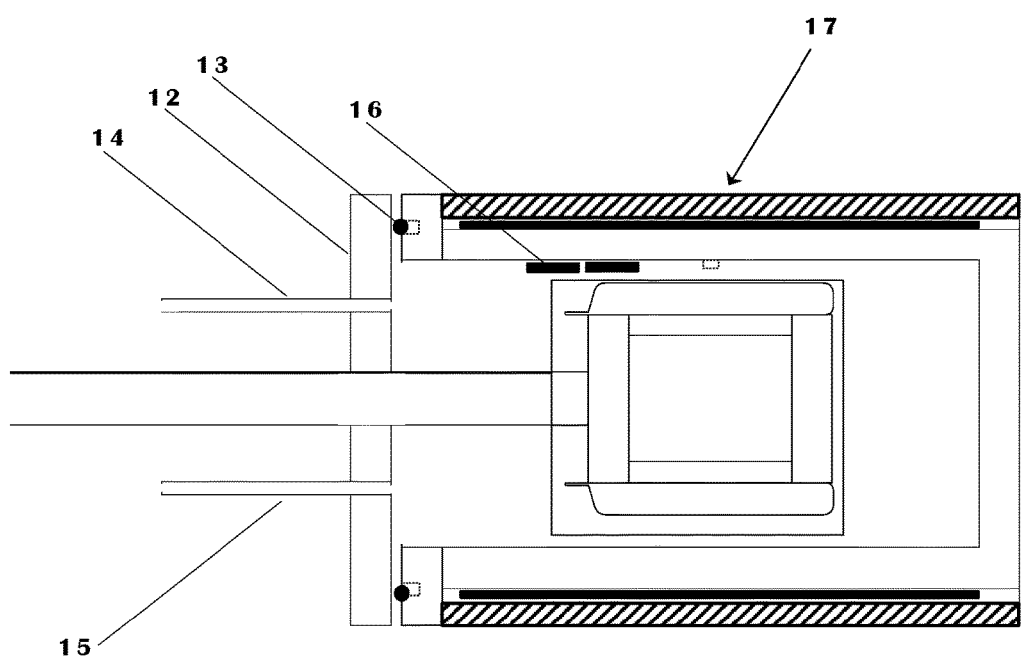
FIG. 5 shows an exemplary assembled inventive DTA device.

FIG. 5 shows an assembled inventive DTA device. A "cut-away" in cryostat can 5 allows the cell holder and pouch cells (as in FIG. 2) to be observed. Stainless steel cryostat lid 12 is silver soldered to thin walled stainless steel tubing 3 supporting the polypropylene frame 1. Silicone o-ring 13 seals cryostat can 5 from air in order to prevent condensation of water on the cells under measurement.

Cryostat can 5 is continuously flushed with a small volume flow of helium gas, ~80 sccm at a small overpressure of 40 kPa, (Praxair UHP grade) so helium gas inlet 14 and helium gas outlet 15 are provided accordingly. The male electrical connector for control RTD 16 (TE Connectivity-66103-4) is attached to wires which are fed within the thin walled stainless steel tubing. The entire DTA device is designated as item 17 so that it can be described with respect to the entire DTA system in FIG. 6.

Figure 6:
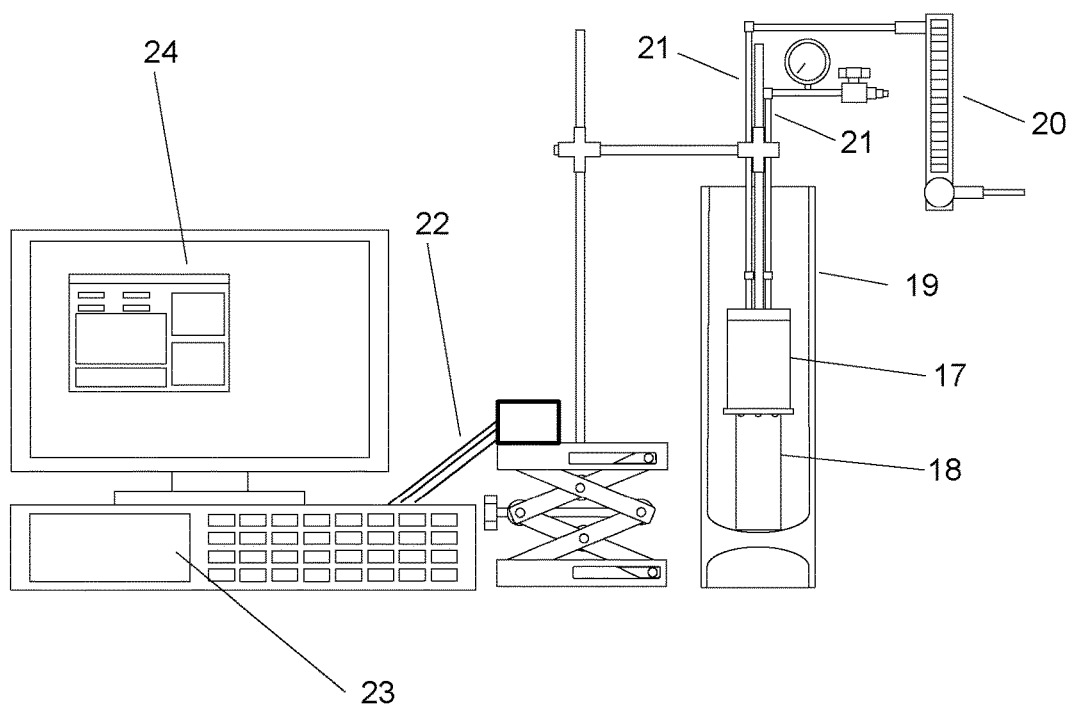
FIG. 6 shows a block diagram of an entire exemplary DTA device of the invention.

FIG. 6 shows a block diagram of an entire exemplary DTA system including the aforementioned DTA device 17. Hollow copper platform 18 is fabricated from 2.5" diameter copper pipe with ¼" wall thickness. A 3" diameter (¼" thick) disc-shaped copper top is soldered to the copper pipe and several 5.65 mm diameter holes are drilled in the sides of the copper pipe just under the copper disc. The copper platform is placed within liquid nitrogen dewar 19 (Cryofab—CF 4515). Rotameter 20 (Matheson—FM1051V) is used to control the flow of helium within helium gas lines 21 connected to a helium cylinder). The necessary electrical connections 22 from DTA device 17 to Lakeshore temperature controller 23 and control computer with VB.NET control software and IEEE-GPIB interface card 24 are also included.

During operation, cryostat can 5 is flushed with a slow steady stream of He gas. The liquid nitrogen dewar is filled with liquid nitrogen to the level of the top of the copper platform. Then the jack stand connected to DTA device 27 is used to lower the DTA device cryostat can onto the top of the copper platform. The thermal coupling between the cold copper platform (−196° C.) and cryostat can 5 is sufficient to cool DTA device 27 to temperatures as low as −120° C. in a reasonable period of time. Then DTA device 27 is lifted off the copper platform. The heater, temperature controller and computer with control software are used to stabilize the temperature at the desired starting point. Then, the heater and temperature controller are instructed to heat the cryostat can 5 at a fixed rate (e.g. 1° C./minute) while the sample cell and reference cell temperatures are monitored versus time.

The following examples illustrate how the DTA system described above can be advantageously used to determine state-of-health of Li ion pouch cells. However, these examples should not be construed as limiting the invention in any way. Those skilled in the art will readily appreciate that other uses are possible for the inventive systems and methods disclosed herein.

Examples 402035 pouch cells (40 mm high×20 mm wide×3.5 mm thick) were obtained dry (without electrolyte) from LiFUN Technologies in China (Li-Fun Technology, Xinma Industry Zone, Golden Dragon Road, Tianyuan District, Zhuzhou City, Hunan Province, PRC, 412000, China). The sample cells were vacuum filled with various amounts of electrolyte within an argon-filled glove box. The electrolyte used in the sample cells was 0.4 M $LiPF_6$ dissolved in ethylene carbonate:dimethyl carbonate 1:2 by weight. Additionally, an electrolyte of 1 M $LiPF_6$ in methyl acetate (MA), which does not freeze above −110° C., was prepared to use in the reference cell. The electrolyte salt and the solvents were obtained from BASF.

Figure 7:
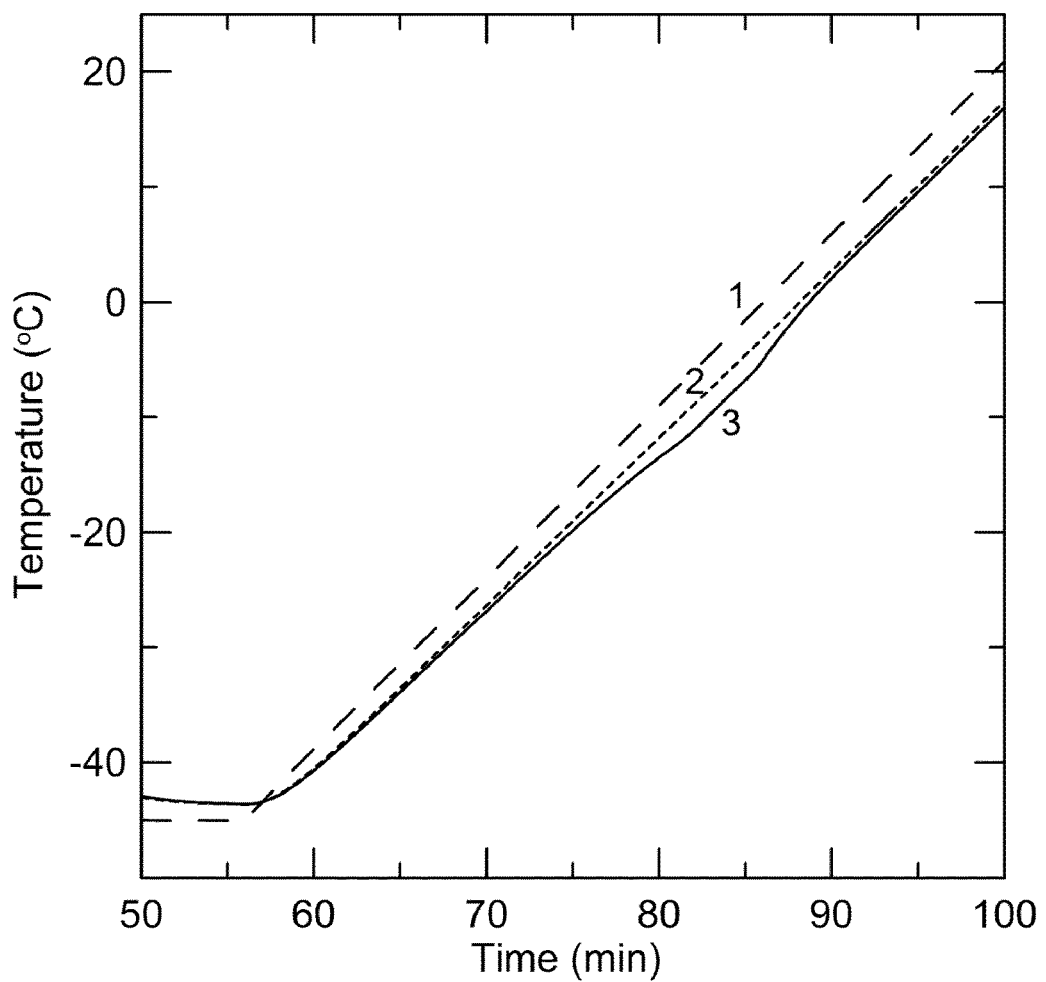
FIG. 7 shows the temperature versus time plots for the cryostat can (curve 1), the reference cell (curve 2) and the sample cell (curve 3) in one of the Examples.
Figure 8:
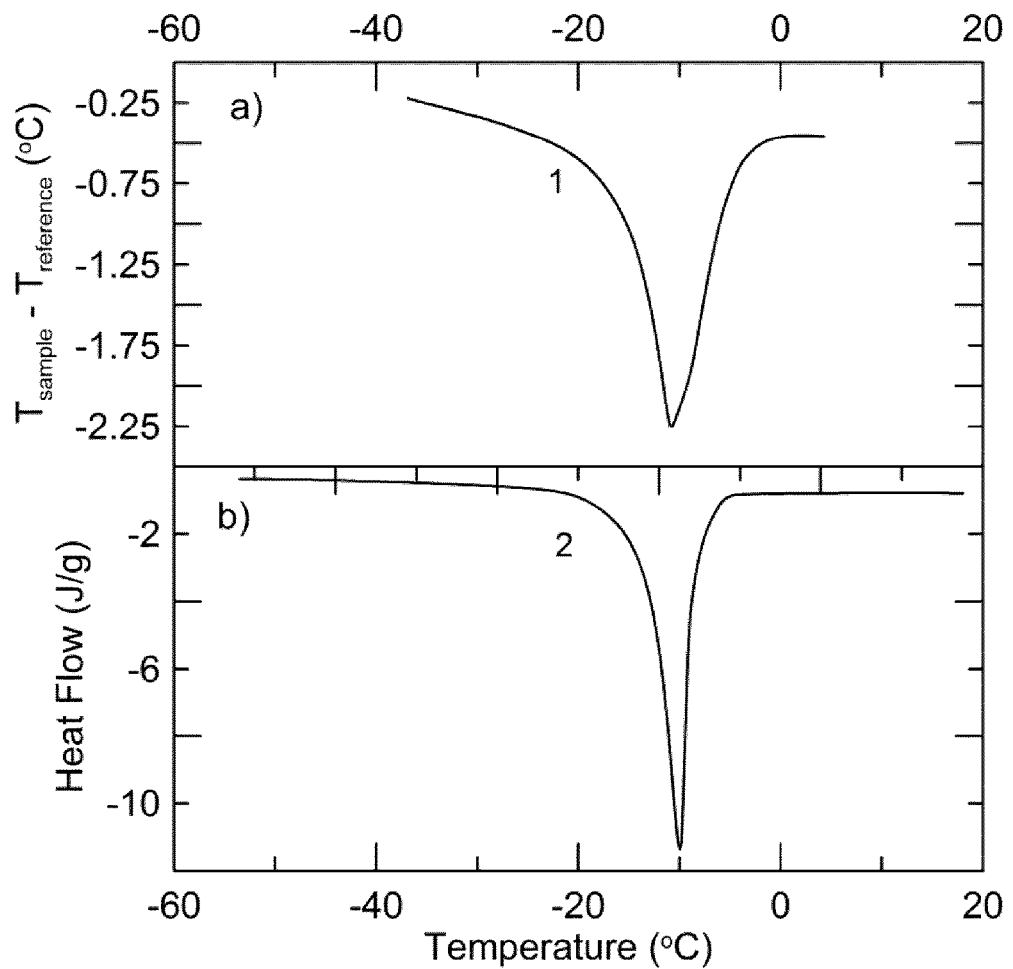
FIG. 8a shows the temperature difference between the sample cell and the reference cell plotted versus temperature in one of the Examples.
FIG. 8b shows a DSC experiment on the same electrolyte as in the sample cell.

FIG. 7 shows temperature versus time plots for the cryostat can (curve 1), the reference cell (curve 2) and the sample cell (curve 3) during an experiment where the heating rate was 1.50° C./min. The sample 402035 cell contained 0.9 grams of 0.4 M $LiPF_6$ EC:DMC electrolyte and the reference 402035 cell contained 0.9 grams of 1 M $LiPF_6$ methyl acetate (Melting point <−110° C.) electrolyte.

FIG. 7 shows that that the cryostat temperature and the reference cell temperature increased linearly in time. FIG. 7 also shows a clear thermal feature (thermal anomaly) in the response of the sample cell near a temperature of −10° C., as expected based on the results in FIG. 2 of Ding et al. [J. Electrochem. Soc. 147 18688 (2000)].

FIG. 8*a* shows the temperature difference between the sample cell and the reference cell plotted versus the temperature of the sample cell for the results in FIG. 7. There is a large response due to the melting of the electrolyte in the sample cell. For comparison, FIG. 8*b* shows the results of a DSC experiment (using a TA Instruments Q1000 DSC) on a few mg of the same electrolyte as in the sample cell which clearly shows the melting of the electrolyte in an analogous manner to that shown in FIG. 8*a*. FIGS. 7, 8*a*, and 8*b* clearly prove that the inventive DTA system can detect the melting of the electrolyte within a complete Li-ion cell.

In order to prove that the DTA system is sensitive to the amount of liquid electrolyte within the pouch type Li-ion cells, a series of five otherwise identical pouch cells were made with different amounts of 0.4 M $LiPF_6$ EC:DMC 1:2 electrolyte as described in Table 1.

TABLE 1

Amount of electrolyte added to 402035 pouch cell and resulting area of feature in ΔT vs. T plot

| Cell | Amount Electrolyte Added (g) | Area of feature in ΔT vs. T plot (° C./° C.) |
| --- | --- | --- |
| 1 | 0.111 | 0.99 |
| 2 | 0.315 | 6.88 |
| 3 | 0.504 | 11.53 |
| 4 | 0.699 | 16.78 |
| 5 | 0.875 | 21.90 |

Figure 9:
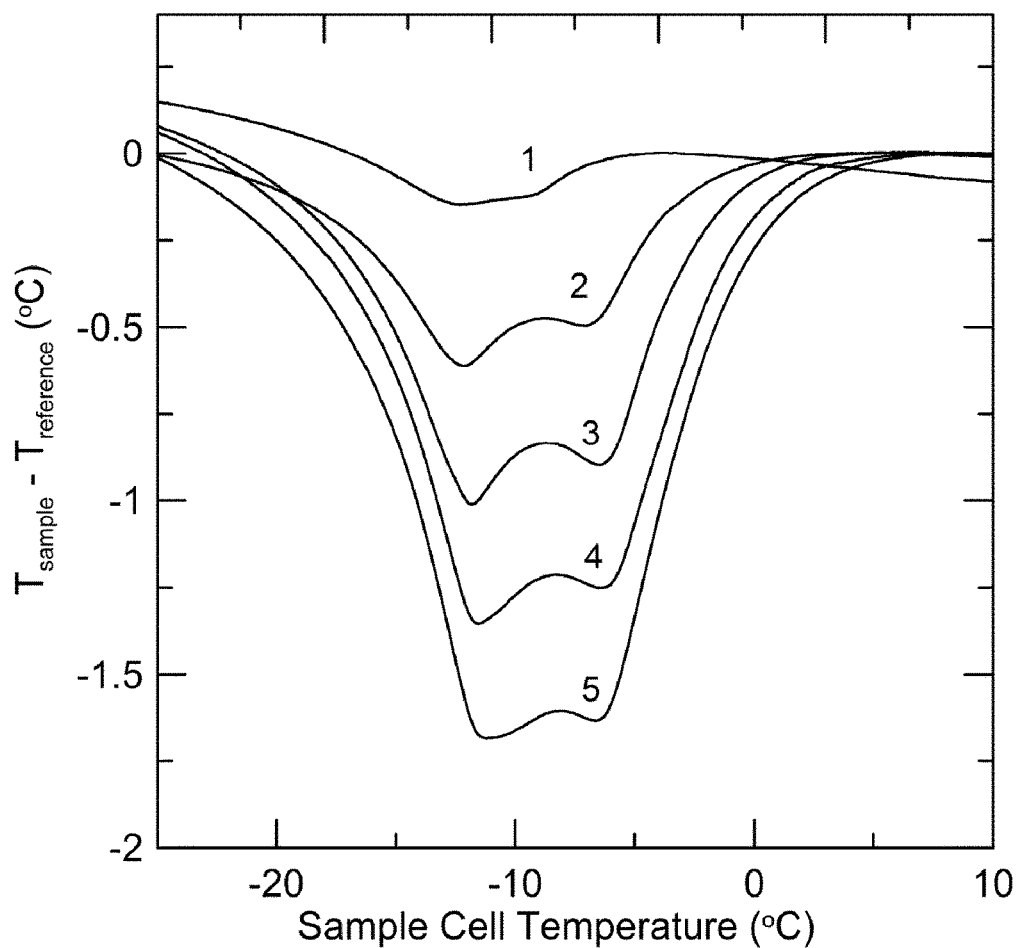
FIG. 9 shows the difference between sample cell and reference cell temperatures ($T_{sample} - T_{reference}$) during heating for cells of the Examples containing different amounts of liquid electrolyte.

FIG. 9 shows the difference between sample cell and reference cell temperatures ($\Delta T = T_{sample} - T_{reference}$) versus the temperature of the sample cell during heating for sample cells containing different amounts of liquid electrolyte as described by Table 1. FIG. 9 clearly shows that the size of the feature in ΔT vs. T increases as the amount of electrolyte within the Li-ion pouch cell increases. Thus, the inventive DTA system is sensitive to the amount of electrolyte remaining in a Li-ion cell.

Figure 10:
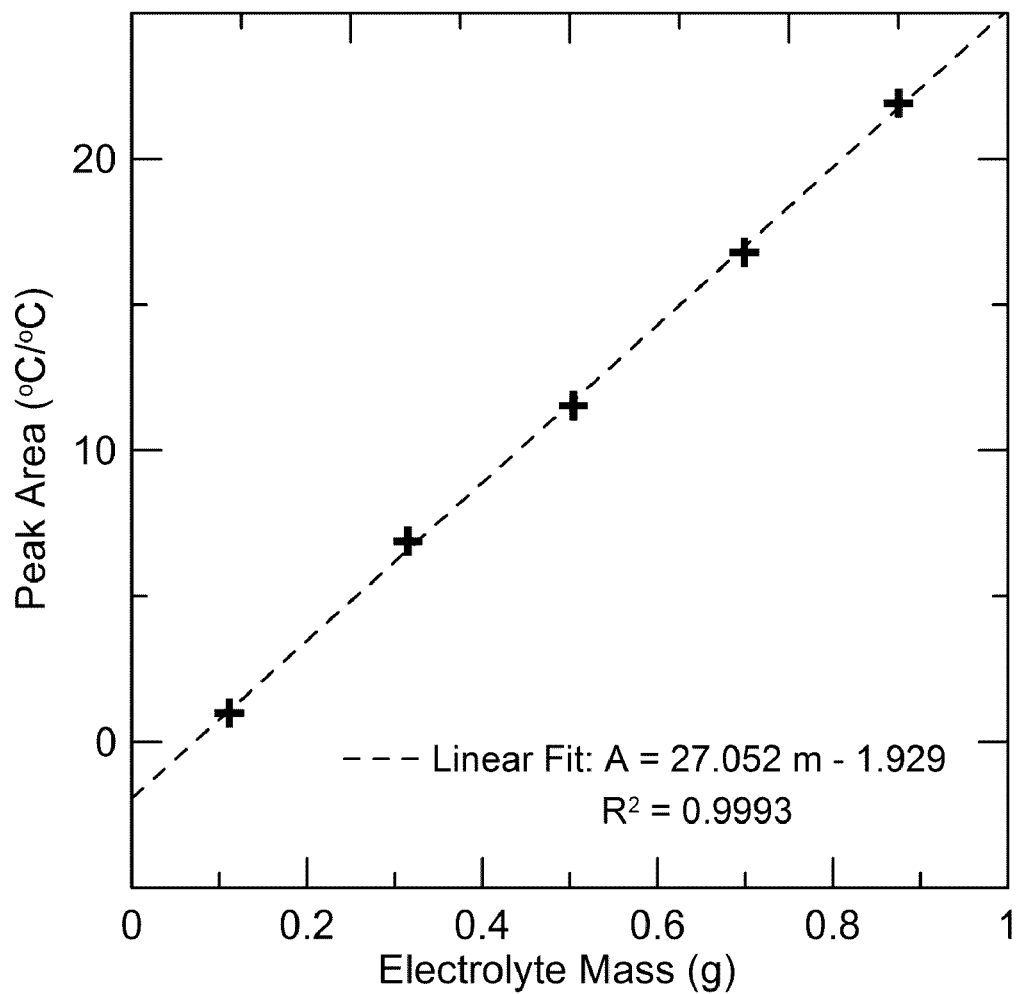
FIG. 10 shows the peak area from FIG. 9 plotted versus electrolyte mass.

FIG. 10 shows the area of the feature in ΔT vs. T from FIG. 9 plotted versus the electrolyte mass. The relationship in FIG. 10 is linear indicating that the size of the feature in ΔT vs. T is proportional to the amount of liquid electrolyte in the cell. This proves that the inventive DTA system can quantitatively detect the amount of liquid electrolyte within a Li-ion cell.

To use the inventive DTA system as a state-of-health indicator for Li-ion cells the following procedure could be used, for example. In a first experiment, a fresh sample Li-ion cell would be measured in the DTA system using an identical cell filled with methyl acetate (or a suitable alternative) electrolyte as the reference cell. In a second experiment, the DTA system would be used to measure an aged (by charge-discharge cycling, storage or use in the field) Li-ion cell of the same type versus the methyl acetate reference cell. The magnitude of the thermal feature in the first experiment would be compared to that in the second experiment in order to determine the fraction of liquid electrolyte remaining. The melting temperature and the features in the thermal response could also change if the liquid electrolyte composition changed significantly in the aged cell as previously discussed.

Figure 11:
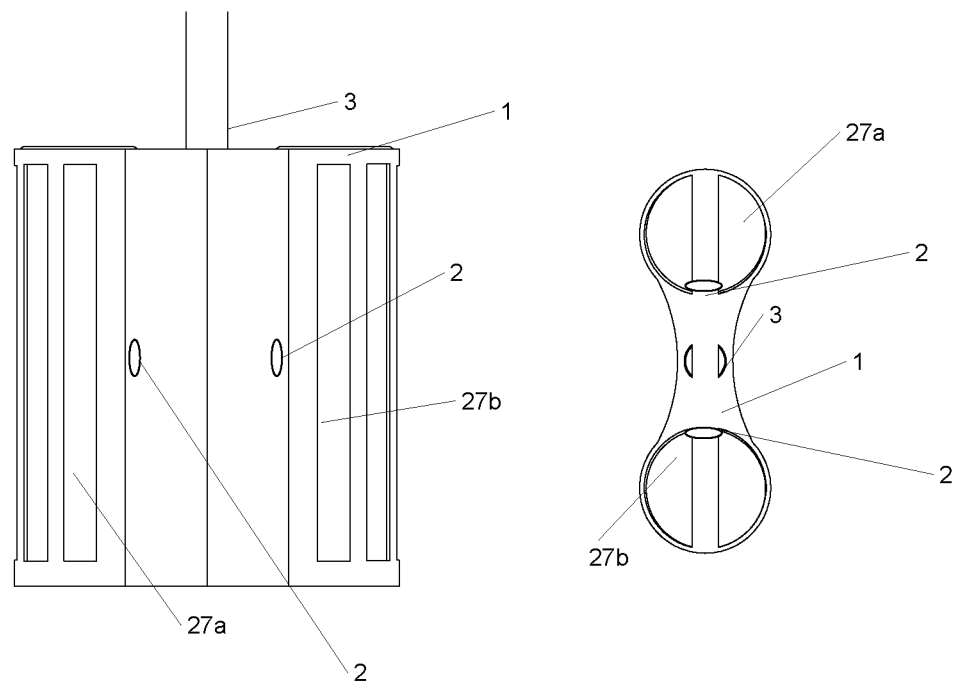
FIG. 11 shows a schematic diagram of an exemplary cell holder for a DTA device designed to measure the remaining electrolyte in 18650-size Li-ion cells.

Obviously, this inventive approach is not limited to 402035-type Li-ion cells, nor to Li-ion cells. As an example, FIG. 11 shows a schematic diagram of a cell holder for a DTA device designed to measure the remaining electrolyte in 18650-size Li-ion cells. Just as in FIGS. 1 and 2, polypropylene frame 1, sample and reference resistance-temperature devices (RTDs) 2, thin walled stainless steel tubing 3 can be used to make up the cell holder. Sample 18650 cell 27a and reference 18650 cell 27b are also shown.

Those skilled in the art will recognize that numerous substitutions of materials and electrical devices can be made without changing the scope of the inventive DTA device and/or system. For example, polypropylene could be substituted by polyethylene, a Lakeshore Temperature controller could be substituted by one made by another manufacturer, etc. Furthermore, the method of the invention is not limited to analyzing Li-ion batteries. Any battery incorporating liquid electrolyte which can be frozen and where the liquid electrolyte is depleted over time during battery operation can be characterized with the instant invention. In cases where the depletion of the liquid electrolyte leads to cell degradation, state-of-health can be determined. Examples of such battery chemistries include Na-ion, Mg-ion, Ca-ion, Li—S and dual graphite. Furthermore, the invention is not limited to batteries and is applicable to many electrochemical devices. For example, electrochemical supercapacitors and carbon-carbon ultracapacitors can be so characterized.

All of the above U.S. patents, U.S. patent applications, foreign patents, foreign patent applications and non-patent publications referred to in this specification, are incorporated herein by reference in their entirety.

While particular elements, embodiments and applications of the present invention have been shown and described, it will be understood, of course, that the invention is not limited thereto since modifications may be made by those skilled in the art without departing from the spirit and scope of the present disclosure, particularly in light of the foregoing teachings. Such modifications are to be considered within the purview and scope of the claims appended hereto.

The invention claimed is:

1. A machine-based method for determining a state-of-health property of a first electrochemical device comprising a first quantity of an electrolyte, the method comprising:

performing a first thermal scan of the first electrochemical device over a temperature range that includes a transition temperature of the electrolyte to cause a transition of at least portions of the first quantity of electrolyte;

during the first thermal scan, measuring a feature of the transition to produce a first measured value corresponding to an amount or composition of the first quantity of electrolyte;

comparing the first measured value against a predetermined second value to produce a measure of aging of the first quantity of electrolyte;

wherein the predetermined second value corresponds to an amount or composition of a second quantity of electrolyte and is predetermined according to a measured feature of a transition of at least portions of the second quantity of electrolyte, the measured feature having been determined during a second thermal scan of a second electrochemical device comprising the second quantity of electrolyte, over the temperature range, with the second thermal scan having caused the transition of said at least portions of the second quantity of electrolyte; and generating a state-of-health indicator for the first electrochemical device based on the measure of aging.

2. The method of claim 1, wherein the first electrochemical device and the second electrochemical device are electrochemical devices of the same type.

3. The method of claim 1, wherein the first electrochemical device has aged more than the second electrochemical device.

4. The method of claim 1, wherein the state-of-health indicator for the first electrochemical device comprises at least one indicator selected from the group consisting of: cycle life of the first electrochemical device, lifetime of the first electrochemical device, electrolyte composition of the first electrochemical device, exposure to abuse of the first electrochemical device, operation outside of manufacturer specifications of the first electrochemical device, or any combination thereof.

5. The method of claim 1, wherein the first electrochemical device is a device selected from the group consisting of: a battery cell, a supercapacitor, or an ultracapacitor.

6. The method of claim 1, wherein the electrochemical device is a rechargeable lithium-ion battery.

7. The method of claim 1, wherein the first thermal scan and the measuring of the feature of the transition of said at least portions of the first quantity of electrolyte are parts of a differential thermal analysis (DTA) measurement process or a differential scanning calorimetry (DSC) measurement process, wherein the feature of the transition of said at least portions of the first quantity of electrolyte is measured differentially relative to a reference that does not undergo a transition over the temperature range.

8. The method of claim 7, wherein the second thermal scan is part of a second differential thermal analysis measurement or a second differential scanning calorimetry measurement, that is performed separately from said DTA measurement or DSC measurement, respectively.

9. The method of claim 1, wherein the first quantity of electrolyte is of an electrolyte type selected from the group consisting of: a liquid electrolyte, a polymer electrolyte, a gel-polymer electrolyte, or a polymer-plasticized-by-liquid electrolyte.

10. The method of claim 1, wherein the transition of at least portions of the first quantity of electrolyte and the transition of at least portions of the second quantity of electrolyte each is of a transition type selected from the group consisting of: a melting transition, a phase transition other than a melting transition, or a glass transition.

11. The method of claim 1, wherein measuring the feature of the transition of at least portions of the first quantity of electrolyte to produce the first measured value comprises measuring the total heat required for that transition.

12. The method of claim 1, wherein the transition of at least portions of the first quantity of electrolyte, and the transition of at least portions of the second quantity of electrolyte both occur at the same transition temperature, and wherein respective amounts of heat transfer required to complete each of those transitions are indicative of respective amounts of electrolyte in the first quantity of electrolyte and in the second quantity of electrolyte.

13. The method of claim 1, further comprising:
performing the second thermal scan and determining the measured feature of the transition of at least portions of the second quantity of electrolyte.

14. The method of claim 1, wherein the measure of aging of the first quantity of electrolyte corresponds to a fraction of electrolyte remaining in the first quantity of electrolyte.

15. An apparatus for determining a state-of-health property of an electrochemical device comprising a first quantity of electrolyte enclosed in a housing, the apparatus comprising:
a device holder sized and constructed to receive the housing of the electrochemical device to be mounted against a receiving surface of the device holder, the device holder further including a temperature sensor situated to contact the housing of the electrochemical device;
a cryostat including an enclosure sized and constructed to receive the device holder and the electrochemical device mounted against the receiving surface of the device holder;
a control system including:
a temperature controller portion operatively coupled to the temperature sensor and to a thermal actuator, the temperature controller portion being operative to vary the temperature of the electrochemical device while measuring that temperature via the temperature sensor; and
a process controller portion operatively coupled to the temperature controller portion and programmed to:
execute a first thermal scan of the electrochemical device over a temperature range that includes a transition temperature of the electrolyte to cause a transition of at least portions of the first quantity of electrolyte;
during the first thermal scan, measure a feature of the transition to produce a first measured value corresponding to an amount or composition of the first quantity of electrolyte;
compare the first measured value against a predetermined second value to produce a measure of aging of the first quantity of electrolyte; and
generate a state-of-health indicator for the electrochemical device based on the measure of aging.

16. The apparatus of claim 15, wherein the predetermined second value corresponds to an amount or composition of a second quantity of electrolyte and is predetermined according to a measured feature of a transition of at least portions of the second quantity of electrolyte, the measured feature having been determined during a second thermal scan of a second electrochemical device comprising the second quantity of electrolyte, over the temperature range, with the second thermal scan having caused the transition of said at least portions of the second quantity of electrolyte.

17. The apparatus of claim 15, wherein the apparatus includes a differential measurement arrangement configured such that:
the device holder is further sized and constructed to receive a second housing of a reference device to be mounted against second receiving surface of the device holder, the device holder further including a second temperature sensor situated to contact the second housing of the reference device; and
the temperature controller is further operatively coupled to the second temperature sensor and further operative to measure the temperature of the reference device via the second temperature sensor.

18. The apparatus of claim 15, wherein the electrochemical device has aged more than the second electrochemical device.

19. The apparatus of claim 15, wherein the state-of-health indicator for the electrochemical device comprises at least one indicator selected from the group consisting of: cycle life of the first electrochemical device, lifetime of the first electrochemical device, electrolyte composition of the first electrochemical device, exposure to abuse of the first electrochemical device, operation outside of manufacturer specifications of the first electrochemical device, or any combination thereof.

20. At least one non-transitory machine-readable medium containing instructions that, when executed by a computer-based control system operatively coupled with a thermal scanner constructed to vary the temperature of an electrochemical device under test, cause the computer-based control system and thermal scanner to:
execute a first thermal scan of the electrochemical device over a temperature range that includes a transition temperature of the electrolyte to cause a transition of at least portions of the first quantity of electrolyte;
during the first thermal scan, measure a feature of the transition to produce a first measured value corresponding to an amount or composition of the first quantity of electrolyte;
compare the first measured value against a predetermined second value to produce a measure of aging of the first quantity of electrolyte; and
generate a state-of-health indicator for the electrochemical device based on the measure of aging.

* * * * *